United States Patent
Shih et al.

(10) Patent No.: US 7,998,660 B2
(45) Date of Patent: Aug. 16, 2011

(54) EXPOSURE METHOD

(75) Inventors: Chiang-Lin Shih, Taipei Hsien (TW); Kuo-Yao Cho, Taichung County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 474 days.

(21) Appl. No.: 12/253,235

(22) Filed: Oct. 16, 2008

(65) Prior Publication Data

US 2010/0009294 A1  Jan. 14, 2010

(30) Foreign Application Priority Data

Jul. 9, 2008 (TW) .............................. 97125937 A

(51) Int. Cl.
  *G03F 7/26* (2006.01)
(52) U.S. Cl. ........................ 430/312; 430/394
(58) Field of Classification Search ................... 430/312, 430/311, 394
  See application file for complete search history.

(56) References Cited

U.S. PATENT DOCUMENTS

| 5,204,224 A * | 4/1993 | Suzuki ........................... 430/315 |
| 5,885,756 A * | 3/1999 | Yun et al. ...................... 430/394 |
| 6,873,938 B1 | 3/2005 | Paxton et al. | |
| 2006/0078828 A1 * | 4/2006 | Atkinson et al. .............. 430/313 |

* cited by examiner

*Primary Examiner* — Kathleen Duda
*Assistant Examiner* — Caleen O Sullivan
(74) *Attorney, Agent, or Firm* — Winston Hsu; Scott Margo

(57) ABSTRACT

An exposure method is disclosed. A wafer coated with a photoresist layer having an exposure threshold dose is provided. The wafer has at least a central region and a peripheral region. Then, a compensating light beam having a first dose directs on the photoresist layer within the peripheral region. Next, a patterned light beam having a second dose is then projected, in a step-and-scan manner, onto the photoresist layer, thereby exposing the photoresist layer. The total dose of the first energy and the second energy is above than the exposure threshold dose.

19 Claims, 8 Drawing Sheets

EXPOSURE METHOD

BACKGROUND OF THE INVENTION

1. Field of the Invention

The present invention relates to an exposure method used in the semiconductor process, more particularly to an exposure method which can correct the variation of the after-etch-inspection critical dimension (AEICD).

2. Description of the Prior Art

Lithography process is an important step in the transfer of the circuit pattern onto the substrate. After the photoresist is exposed to a patterned light beam and developed and after the substrate is etched, the substrate not covered by the photoresist is removed. In this way, the pattern can be transferred onto the substrate.

However, during the etching process, including wet etching and dry etching, due to the loading effect, the etching rate of the die region near the periphery of the wafer is different from the etching rate of the die region near the center of the wafer. Therefore, the after-etch-inspection critical dimension (AEICD) will vary in the die region located in different positions of the wafer. Accordingly, in the semi-conductor field, one of the challenges is to improve the AEICD uniformity.

SUMMARY OF THE INVENTION

It is therefore an objective of the present invention to provide an exposure method to correct the variation of the AEICD caused by the loading effect.

According to a preferred embodiment of the present invention, an exposure method includes: initially, a wafer covered by a photoresist layer having an exposure threshold dose is provided, and the wafer includes a center region and a peripheral region surrounding the center region, wherein the peripheral region is free of overlapping the center region. Next, a compensating light beam having a first dose is directed onto the photoresist layer within the peripheral region. Then, a die region positioned in both the center region and the peripheral region is provided. Finally, a patterned light beam having a second dose is projected, in a step-and-scan manner, onto the photoresist layer, whereby the photoresist layer in the die region is exposed, wherein both the compensating light beam and the patterned light beam are directed onto the photoresist layer within the die region.

According to another preferred embodiment of the present invention, an exposure method, includes: first, a wafer covered by a photoresist layer having an exposure threshold dose is provided, and the wafer comprises a center region and a peripheral region surrounding the center region, wherein the peripheral region is free of overlapping the center region. After that, a first stage radiation is processed by directing a compensating light beam having a first dose onto the photoresist layer within the peripheral region. Finally, a second stage radiation is processed by projecting a patterned light beam having a second dose onto the photoresist layer, wherein the total dose of the first dose and the second dose is above than the exposure threshold dose of the photoresist layer.

According to another preferred embodiment of the present invention, an exposure method, includes: initially, a wafer covered by a photoresist layer is provided, and the wafer comprises a die region, wherein the die region comprises a first area and a second area, and the first area is free of overlapping the second area. Then, a first stage radiation is processed by directing a compensating light beam having a first dose onto the photoresist layer within the first area and the second area. Finally, a second stage radiation is processed by projecting a patterned light beam having a second dose onto the photoresist layer within the first area and the second area.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
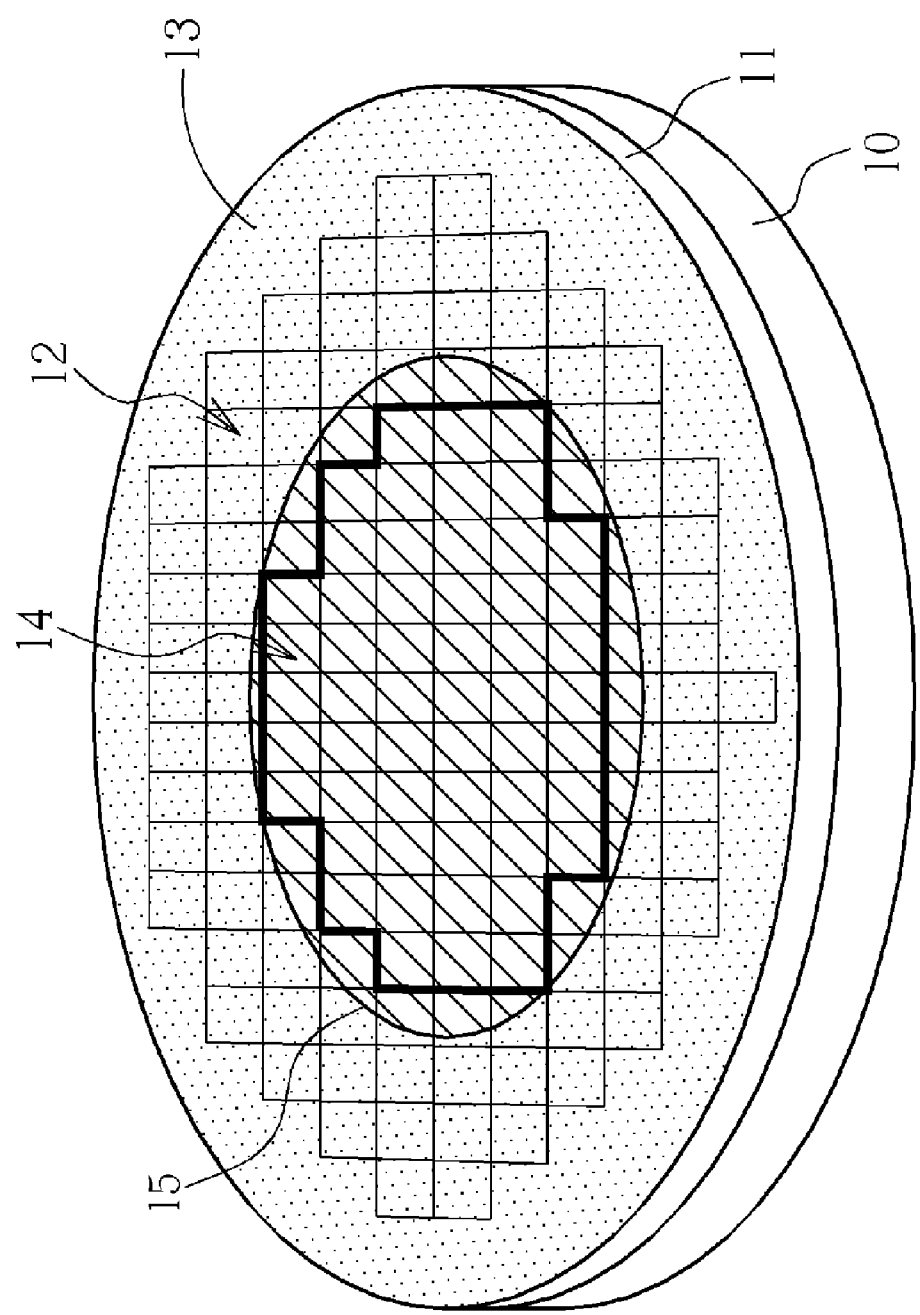
FIG. 1 is a schematic diagram illustrating a feedback controlling system in accordance with the first embodiment of the present invention.

FIG. 1 is a schematic drawing illustrating a top view of a wafer. As shown in FIG. 1, a wafer 10 covered by a photoresist layer 11 having an exposure threshold dose is provided. The wafer 10 is divided into a plurality of die regions each including a plurality of dies. For example, a first die region 12 is positioned at the periphery of the wafer 10 and a second die region 14 (surrounded by a bold line) is positioned in the center of the wafer 10. The first die region 12 and the second die region 14 do not overlap with each other. Furthermore, the wafer 10 is divided into a peripheral region 13 (marked by dots) and a center region 15 (marked by oblique lines). The peripheral region 13 and the center region 15 do not overlap with each other and the peripheral region 13 surrounds the center region 15. In addition, at least a part of the first die region 12 overlaps the peripheral region 13. The peripheral region 13 is a region influenced by the loading effect. According to a preferred embodiment of the present invention, the peripheral region 13 is a circular region positioned at the periphery of the wafer.

Figure 2A:
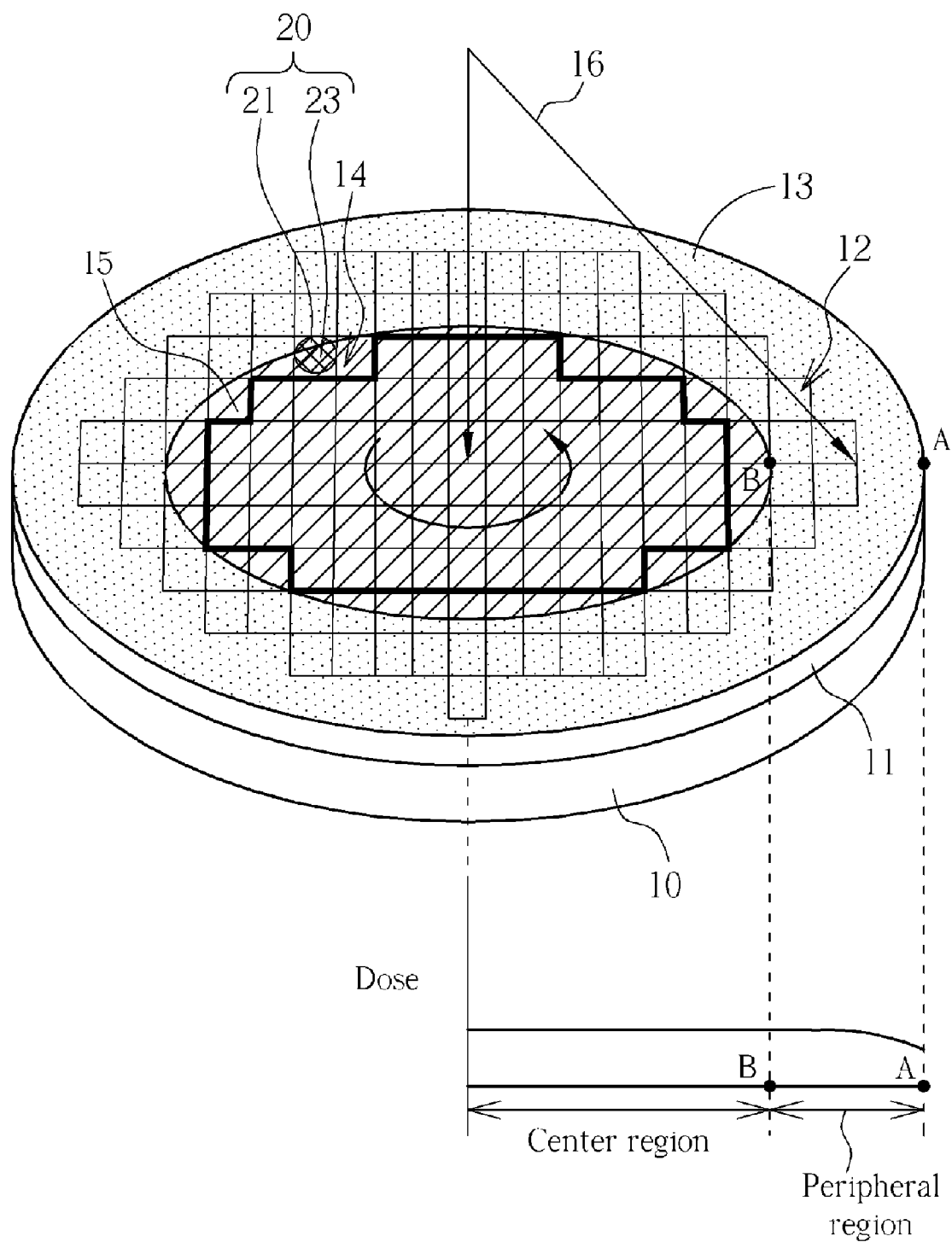
FIG. 2a shows a first stage radiation process: directing a compensating light beam having a first dose onto the wafer according to the first embodiment of the present invention.
Figure 2B:
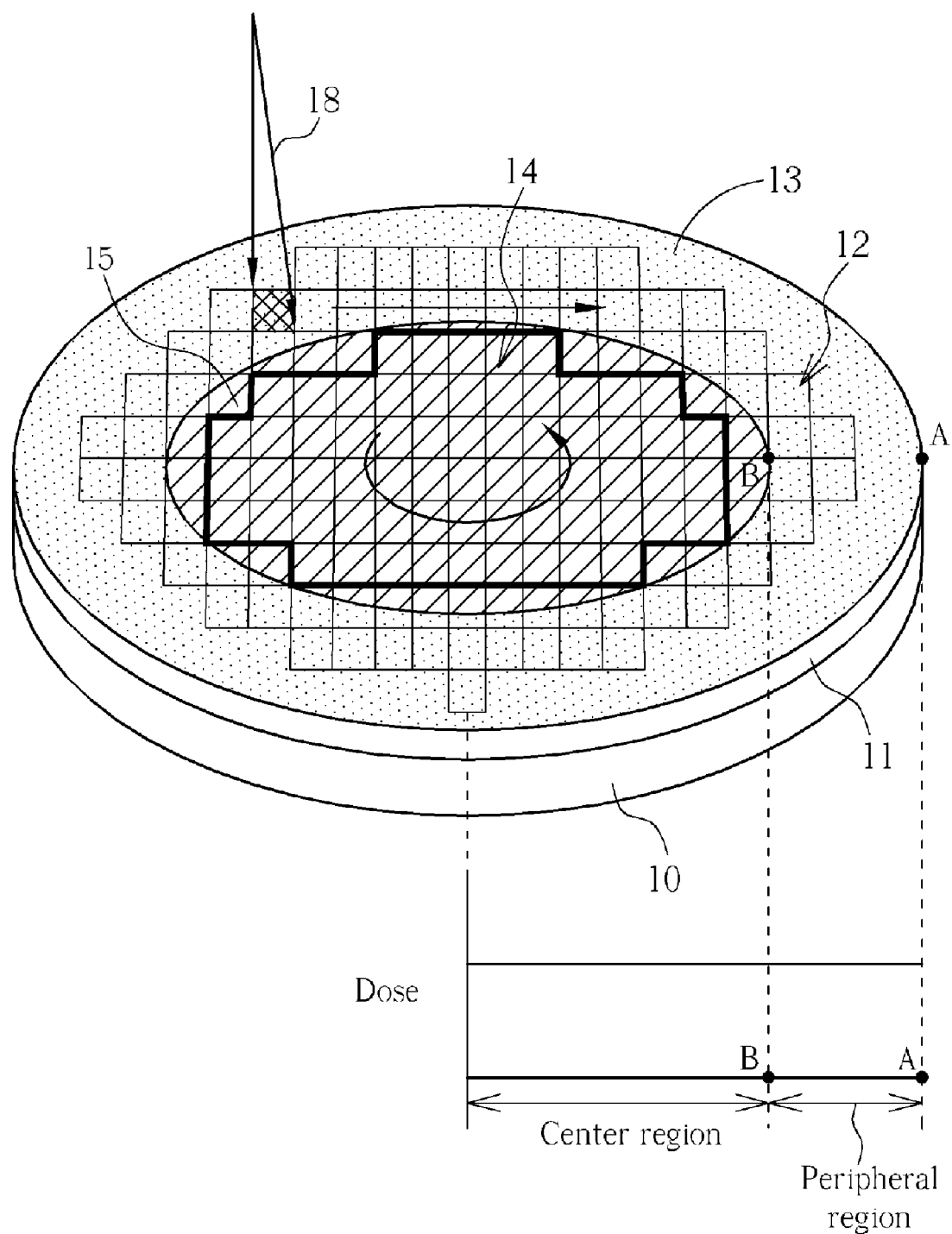
FIG. 2b shows a second stage radiation process: projecting a patterned light beam having a second dose onto the wafer according to the first embodiment of the present invention.

FIG. 2a shows a first stage radiation process: directing a compensating light beam having a first dose onto the wafer according to the first embodiment of the present invention. FIG. 2b shows a second stage radiation process: projecting a patterned light beam having a second dose onto the wafer according to the first embodiment of the present invention.

Please refer to FIG. 1, FIG. 2a and FIG. 2b together. As shown in FIG. 2a, the exposure method according to the first embodiment of the present invention has the steps as follows: initially, the wafer 10 is performed a first-stage radiation. During the first-stage radiation, a compensating light beam 16 having a first dose is directed onto the photoresist layer 11 within the peripheral region 13 and the center region 15. The main purpose of the compensating light beam 16 is not for exposure. In other word, the compensating light beam directs onto the photoresist layer 11 without blocking.

The feature of the first embodiment of the present invention is that the first dose of the compensating light beam 16 in the center region 15 is uniform. The first dose of the compensating light beam 16 in the peripheral region having a distribution that gradually decreases from point B which is near the center of the wafer 10 along the direction of a radius of the wafer 10 to the point A which is near the edge of the wafer 10. Furthermore, a part of the first die region 12 overlaps with the center region 15 and the peripheral region 13, such as an overlapping region 20 (marked by a circle) which represents a die. A first area 21 in the overlapping region 20 is the overlapping part of the first die region 12 and of the peripheral region 13. A second area 23 in the overlapping region 20 is the overlapping part of the first die region 12 and of the center region 15. The first dose is uniform in the second area 23 and the first dose in the second area 23 is the same as that in the center region 15. However, the first dose varies with the position of the first area 21 on the wafer 10. Furthermore, the first dose of the compensating light beam 16 is less than the exposure threshold dose of the photoresist layer 11.

Then, as shown in FIG. 2b, the wafer 10 undergoes a second-stage radiation. During the second-stage radiation, a light beam 18 having a second dose projects onto the photoresist layer 11 within the first die region 12 and the second die region 14 in a step-and-scan manner. The purpose of the light beam 18 is for patterning. That is to say, the light beam 18 passes though a photomask (not shown) to pattern the photoresist layer 11. In addition, the second dose of the light beam 18 is uniform in the peripheral region 13 and the center region 15. The second-stage radiation is preferably performed in a scanning machine. The first-stage radiation can be performed in a scanning machine or in other exposure machines.

Figure 3:
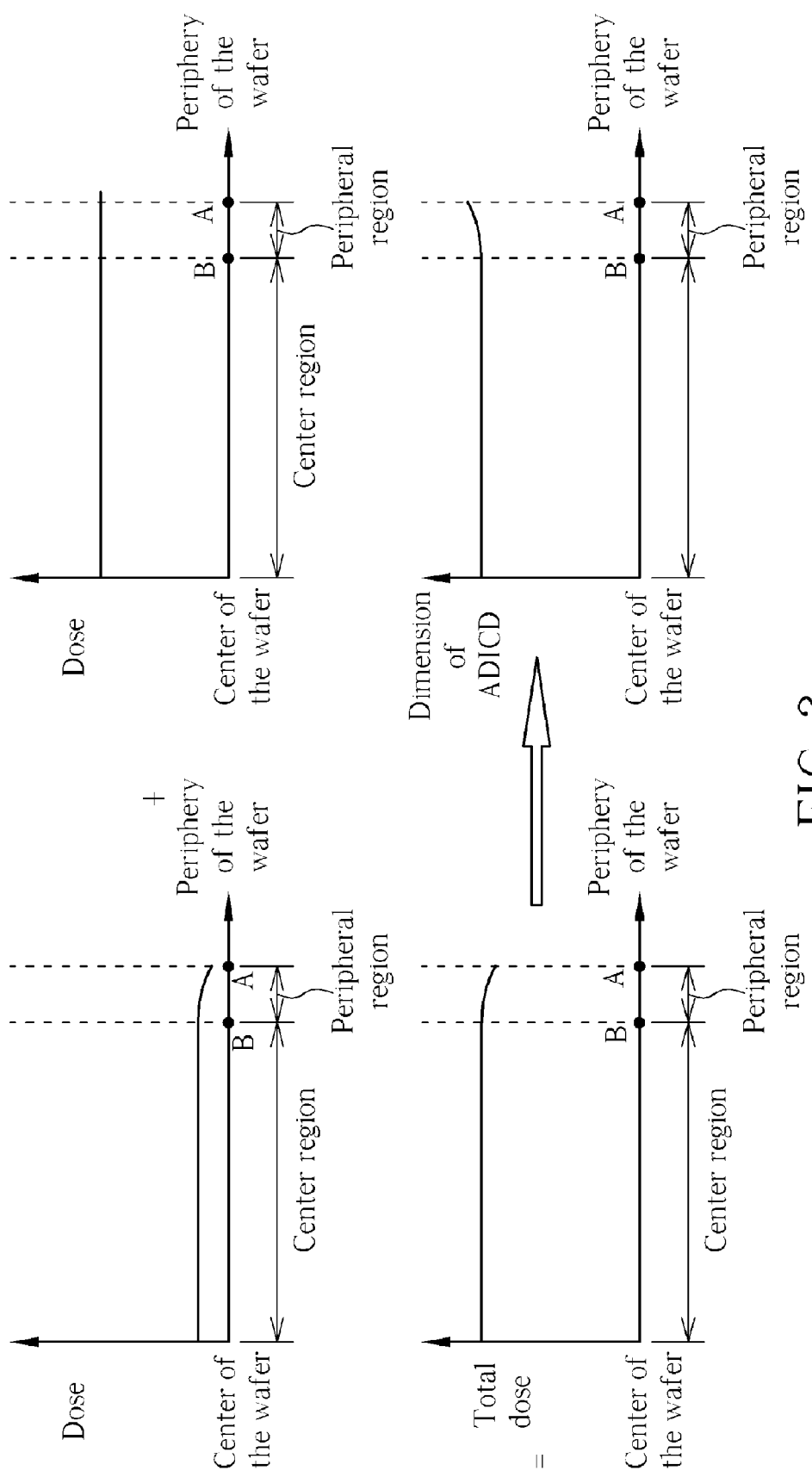
FIG. 3 depicts diagrams illustrating the relation between the dimension of the ADICD and the dose distribution of two-stage radiation according to the first embodiment of the present invention.

FIG. 3 depicts diagrams illustrating the relation between the dimension of the ADICD and the dose distribution of two-stage radiation according to the first embodiment of the present invention.

As shown in FIG. 3, after the first stage radiation and the second stage radiation, the total dose of the first dose and the second dose in the center region 15 is uniform, and the total dose of the first dose and the second dose in the peripheral region 13 has a distribution that gradually decreases from point B to point A. Therefore, after the photoresist is developed, the after development inspect critical dimension (ADICD) in the peripheral region 13 has a distribution that will gradually increase from a region near the center of the wafer along the direction of a radius of the wafer. That is to say, the ADICD distribution will gradually increase from point B to point A. In this way, the variation of AEICD in the peripheral region 13 and the center region 15 due to loading effect can be compensated before the etching process. Accordingly, the AEICD will be uniform in the peripheral region 13 and the center region 15.

Moreover, the compensating light beam 16 and the light beam 18 have the same wave length. The second dose can be more or less than the threshold dose of the photoresist layer 11. As long as the total dose of the first dose and the second dose is above than the exposure threshold dose of the photoresist layer 11.

According to a variation of the first embodiment, the first-stage radiation can be performed by projecting the light beam 18 onto the first die region 12 and the second die region 14 of the wafer 10 in a step-and-scan manner. The second-stage radiation can be performed by directing the compensating light beam 16 onto the photoresist layer 11 of the wafer 10.

According to the second embodiment of the present invention, another exposure method is provided in the present invention. Unlike the first embodiment, the compensating light beam in the peripheral region has a distribution that gradually increases from a region near the center of the wafer along the direction of a radius of the wafer in the second embodiment. The elements with the same function in the second embodiment will use the same numeral as that in the first embodiment.

Figure 4A:
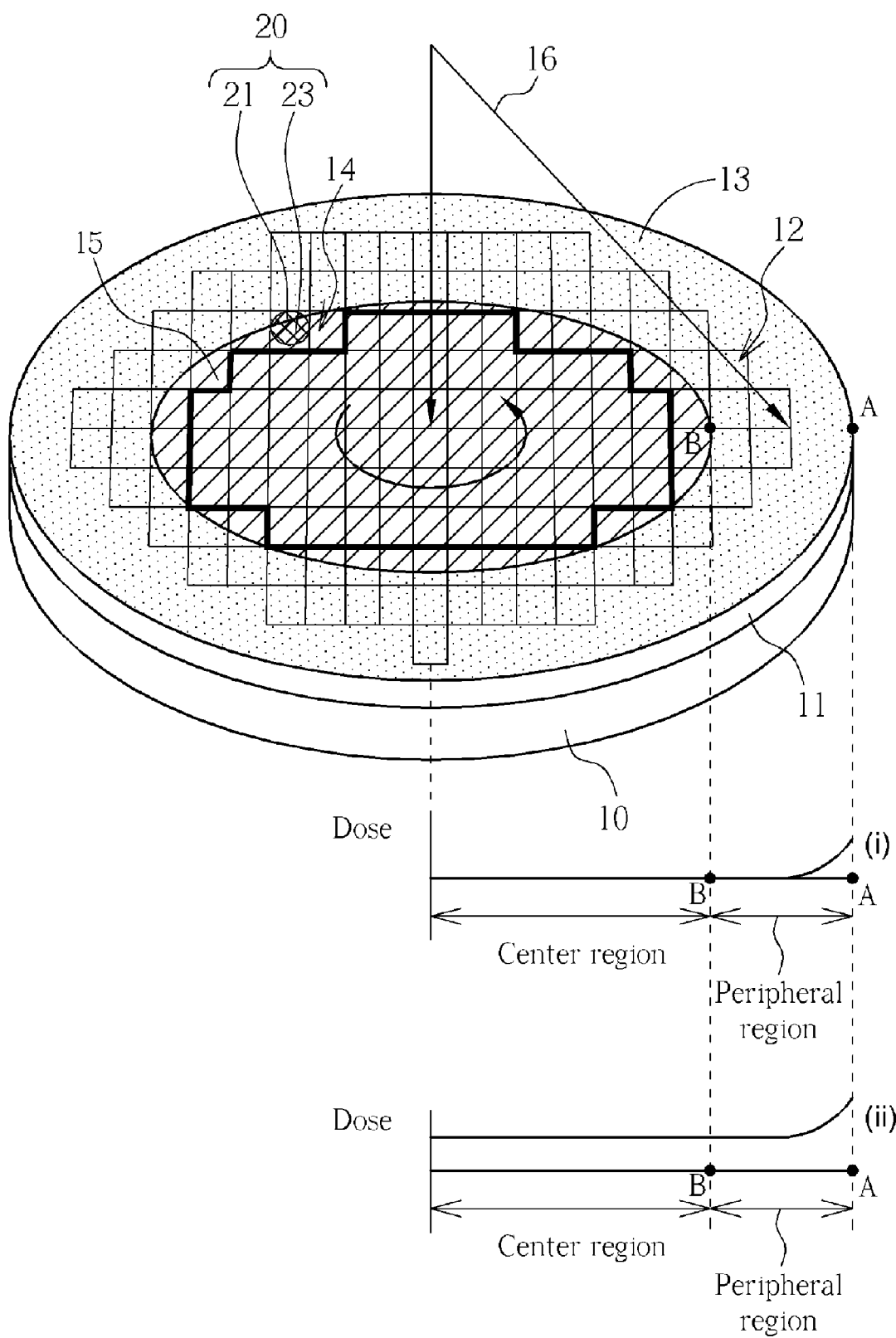
FIG. 4a shows a first stage radiation process: directing a compensating light beam having a first dose onto the wafer according to a second embodiment of the present invention.
Figure 4B:
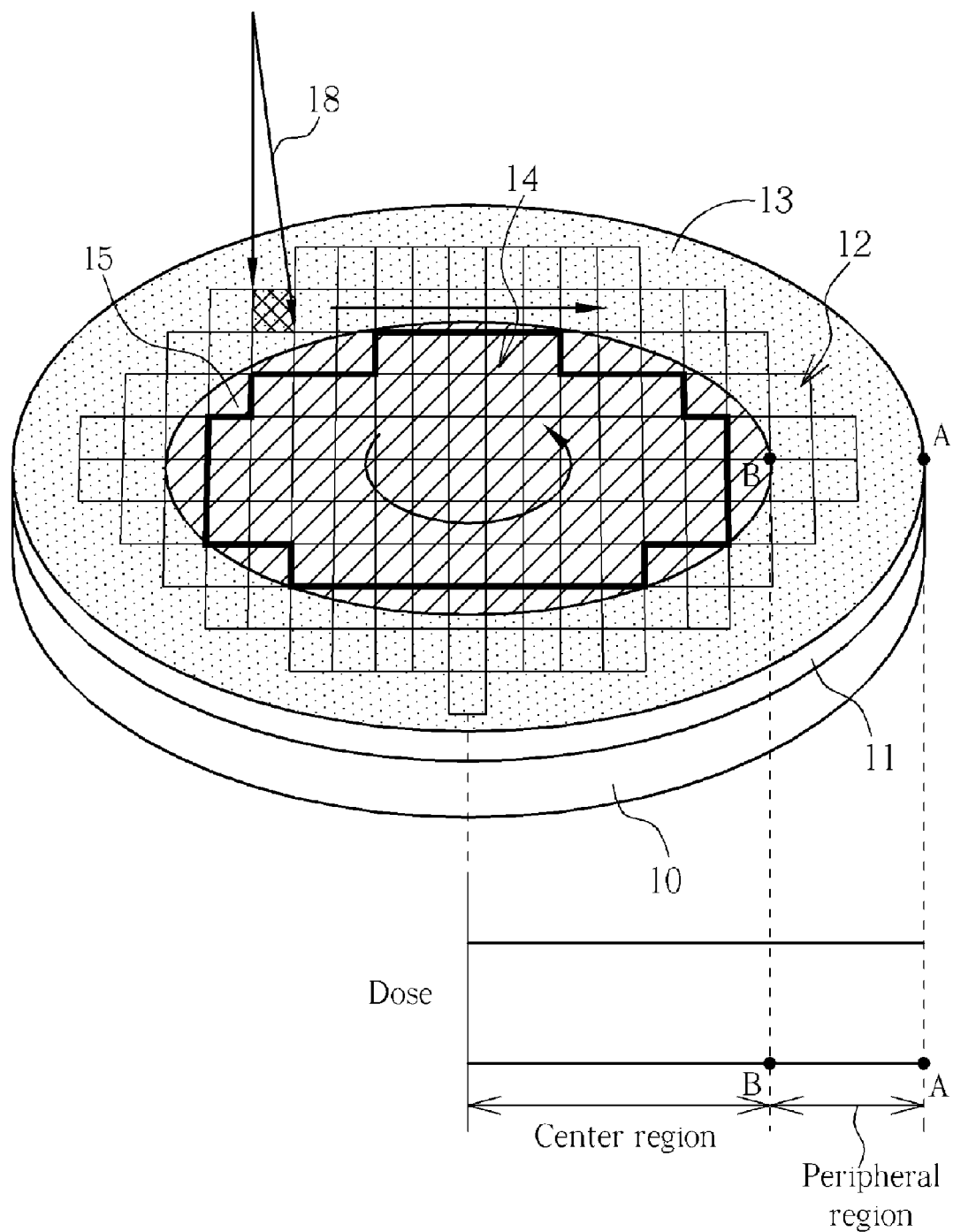
FIG. 4b shows a second stage radiation process: projecting a patterned light beam having a second dose onto the wafer according to a second embodiment of the present invention.

FIG. 4a shows a first stage radiation process: directing a compensating light beam having a first dose onto the wafer according to the second embodiment of the present invention. FIG. 4b shows a second stage radiation process: projecting a patterned light beam having a second dose onto the wafer according to the second embodiment of the present invention.

Please refer to FIG. 1, FIG. 4a and FIG. 4b together. As shown in FIG. 4a, the exposure method according to the second embodiment of the present invention has the steps as follows: initially, the wafer 10 undergoes a first-stage radiation. During the first-stage radiation, a compensating light beam 16 having a first dose is directed onto the photoresist layer 11 within the first die region 12 in the peripheral region 13. The photoresist layer 11 has a threshold dose for exposure. The main purpose of the compensating light beam 16 is not for patterning used in photoresist layer 11. In addition, the first dose is zero in the center region 15. However, in the peripheral region 13, the first dose distribution of the compensating light beam 16 is gradually increased from point B which is near the center of the wafer along the direction of a radius of the wafer 10 to the point A. (please refer to the Roman numeral (i) in FIG. 4a) In addition, the first dose is less than the threshold dose of the photoresist layer 11. The first dose is zero in the center region 15, which means the compensating light beam 16 does not direct onto the center region 15. However, according to different requirements, the compensating light beam 16 can direct onto the center region 15 uniformly. (please refer to Roman numeral (ii) in FIG. 4a) An overlapping region 20 includes a first area 21 and a second area 23. During the first-stage radiation, the first dose is uniform in the second area 23 and the first dose in the second area 23 is the same as that in the center region 15. However, in the first area 21, the first dose varies with the position of the first area 21 on the wafer 10.

Then, as shown in FIG. 4b, the wafer 10 undergoes a second-stage radiation. During the second-stage radiation, a light beam 18 having a second dose projects onto the photoresist layer 11 within the first die region 12 and the second die region 14 in a step-and-scan manner. The light beam 18 is for exposure. In addition, the second dose of the light beam 18 is uniform in the peripheral region 13 and the center region 15.

Figure 5:
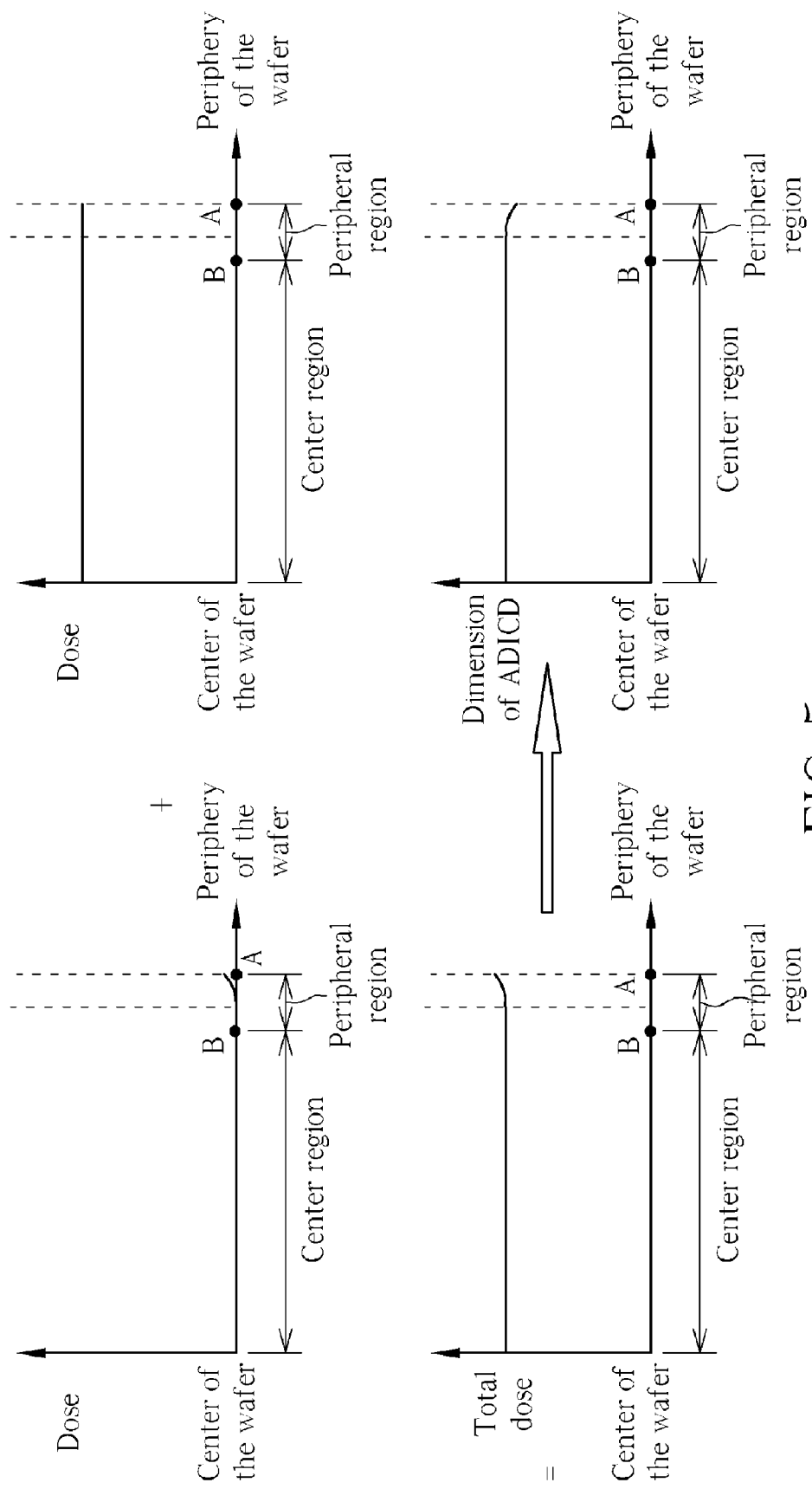
FIG. 5 depicts diagrams illustrating the relation between the dimension of the ADICD and the dose distribution of two-stage radiation according to the second embodiment of the present invention.

FIG. 5 depicts diagrams illustrating the relation between the dimension of the ADICD and the dose distribution of two-stage radiation according to the second embodiment of the present invention.

As shown in FIG. 5, the total dose of the first dose and the second dose in the center region 15 is uniform. On the contrary, the total dose distribution of the first dose and the second dose in the peripheral region 13 is increased from point B to point A. Therefore, after the photoresist is developed, the after development inspect critical dimension (ADICD) distribution in the peripheral region 13 will gradually decrease from a region near the center of the wafer along the direction of a radius of the wafer. That is to say, the ADICD will decrease from point B to point A. Since the ADICD is adjusted before the etching process, the AEICD will be uniform in the peripheral region 13 and the center region 15.

Moreover, the compensating light beam 16 and the light beam 18 have the same wave length. The second dose can be more or less than the threshold dose of the photoresist layer 11, as long as the total dose of the first dose and the second dose are above than the exposure threshold dose of the photoresist layer 11.

According to a variation of the second embodiment, the first-stage radiation can be performed by projecting the light beam 18 on the first die region 12 and the second die region 14 of the wafer 10 in a step-and-scan manner. The second-stage radiation can be performed by directing the compensating light beam 16 onto the photoresist layer 11 of the wafer 10. That is to say, as long as the compensating light beam 16 is directing onto the photoresist layer 11 before the wafer is developed, the variation of the AEICD can be corrected.

Figure 6:
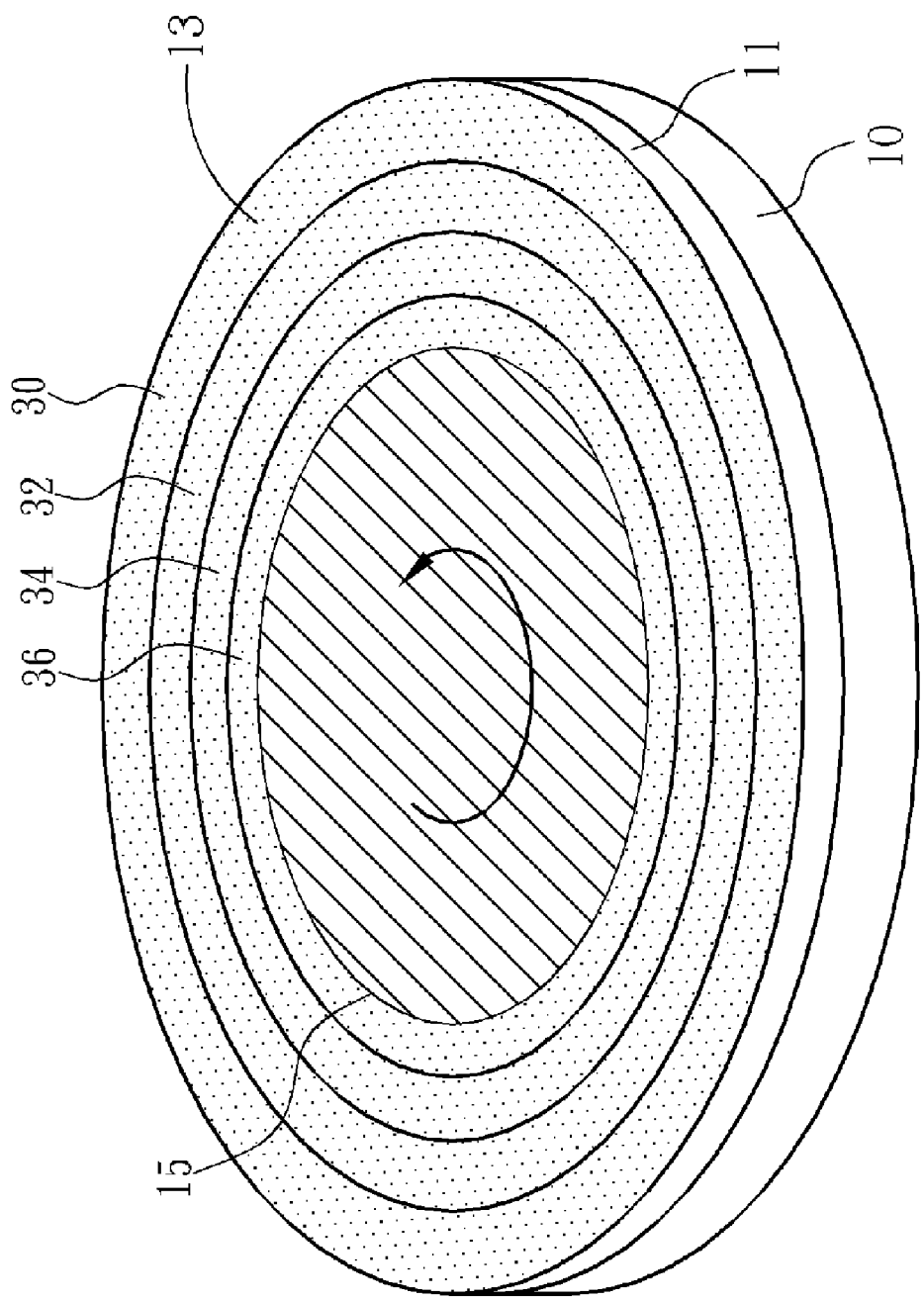
FIG. 6 shows a side view of the wafer having a plurality of circular regions.

FIG. 6 show a side view of the wafer 10 having a plurality of circular regions. To simplify the illustration, the first die region and the second die region are omitted.

The first embodiment and the second embodiment illustrate that the first dose in the peripheral region has dose distribution that gradually decreases or increases from a region near the center of the wafer along the direction of a radius of the wafer. The projecting route of the first dose is illustrated as follows for example.

As shown in FIG. 6, the peripheral region 13 is divided into a plurality of circular regions, such as circular regions 30, 32, 34, 36. The compensating light beam 16 of different dose respectively encircles directing on each one of the circular regions 30, 32, 34, 36 when the wafer is rotating. The first dose in the same circular region is uniform. In addition, please refer to FIGS. 2a, 4a and 6. The dose is not uniform in a die which is part of the peripheral region 13 and part of the center region 14. For example, the dose received by the photoresist layer 11 in the first area 21 and the second area 23 is different.

According to the present invention, the ADICD is adjusted by directing a compensating light beam 16 onto the region on the wafer which is affected by the loading effect. Therefore, the variation of the AEICD in the peripheral region and the center region can be corrected, and the AEICD in the peripheral region and the center region can be uniform. In addition, the dose received by each die region is identical when running the step-and-scan exposure process. Therefore, the cost for running the step-and-scan exposure process can be decreased.

Those skilled in the art will readily observe that numerous modifications and alterations of the device and method may be made while retaining the teachings of the invention.

What is claimed is:

1. An exposure method, comprising:
providing a wafer covered by a photoresist layer having an exposure threshold dose, and the wafer comprising a center region and a peripheral region surrounding the center region, wherein the peripheral region is free of overlapping the center region and the photoresist layer is disposed within the center region and the peripheral region;
projecting a compensating light beam having a first dose onto the photoresist layer within the peripheral region;
providing a die region positioned in the center region and in the peripheral region; and
projecting a patterned light beam having a second dose, in a step-and-scan manner, onto the photoresist layer within the center region and the peripheral region, thereby exposing the photoresist layer in the die region, wherein both the compensating light beam and the patterned light beam are directed onto the photoresist layer within the die region.

2. The method of claim 1, wherein the compensating light beam directing process is encircling directing onto the photoresist layer within the peripheral region.

3. The method of claim 1, wherein the first dose in the peripheral region has a distribution that gradually decreases from a region near the center of the wafer along the direction of a radius of the wafer.

4. The method of claim 1, wherein the first dose in the peripheral region has a distribution that gradually increases from a region near the center of the wafer along the direction of a radius of the wafer.

5. The method of claim 1, wherein the first dose is less than the exposure threshold dose of the photoresist layer.

6. The method of claim 1, wherein the second dose is more than the exposure threshold dose of the photoresist layer.

7. The method of claim 1, wherein the second dose is less than the threshold dose of the photoresist layer.

8. An exposure method, comprising:
providing a wafer covered by a photoresist layer having an exposure threshold dose, and the wafer comprising a center region and a peripheral region surrounding the center region, wherein the peripheral region is free of overlapping the center region and the photoresist layer is disposed within the center region and the peripheral region;
processing a first stage radiation by directing a compensating light beam having a first dose onto the photoresist layer within the peripheral region; and
processing a second stage radiation by projecting a patterned light beam having a second dose onto the photoresist layer within the center region and the peripheral region, wherein the total dose of the first dose and the second dose is above than the exposure threshold dose of the photoresist layer.

9. The method of claim 8, wherein the first stage radiation comprises the step of the compensating light beam having the first dose encircling directs onto the photoresist layer within the peripheral region.

10. The method of claim 8, wherein the second stage radiation comprises the step of projecting the patterned light beam having the second dose onto the photoresist layer in a step-and-scan manner.

11. The method of claim 8, wherein the first dose in the peripheral region has a distribution that gradually decreases from a region near the center of the wafer along the direction of a radius of the wafer.

12. The method of claim 8, wherein the first dose in the peripheral region has a distribution that gradually increases from a region near the center of the wafer along the direction of a radius of the wafer.

13. The method of claim 8, wherein the first dose is less than the exposure threshold dose of the photoresist layer.

14. The method of claim 13, wherein the second dose is more than the exposure threshold dose of the photoresist layer.

15. The method of claim 8, wherein the second dose is less than the threshold dose of the photoresist layer.

16. An exposure method, comprising:
providing a wafer covered by a photoresist layer, and the wafer comprising a die region, wherein the die region comprises a first area and a second area, and the first area free of overlapping the second area;

processing a first stage radiation by directing a compensating light beam having a first dose onto the photoresist layer within the first area and the second area; and processing a second stage radiation by projecting a patterned light beam having a second dose onto the photoresist layer within the first area and the second area.

17. The method of claim 16, wherein the first stage radiation can be divided into a first sub-stage radiation that directing the compensating light beam having a first sub-dose onto the photoresist layer within the first area and a second sub-stage radiation that directing the compensating light beam having a second sub-dose onto the photoresist layer within the second area.

18. The method of claim 17, wherein the first sub-dose varies with the position of the first area on the wafer.

19. The method of claim 17, wherein the second sub-dose is uniform.

* * * * *